US012315847B2

(12) United States Patent
Kwon et al.

(10) Patent No.: US 12,315,847 B2
(45) Date of Patent: May 27, 2025

(54) DISPLAY DEVICE

(71) Applicant: LG Display Co., Ltd., Seoul (KR)

(72) Inventors: Hyowon Kwon, Suwon-si (KR); KiHan Kim, Paju-si (KR); Hyokang Lee, Seoul (KR); JunHyuk Song, Seoul (KR)

(73) Assignee: LG Display Co., Ltd., Seoul (KR)

( * ) Notice: Subject to any disclaimer, the term of this patent is extended or adjusted under 35 U.S.C. 154(b) by 441 days.

(21) Appl. No.: 17/532,608

(22) Filed: Nov. 22, 2021

(65) Prior Publication Data

US 2022/0165716 A1   May 26, 2022

(30) Foreign Application Priority Data

Nov. 23, 2020   (KR) .................. 10-2020-0158267

(51) Int. Cl.
*H01L 25/075* (2006.01)
*H01L 23/538* (2006.01)
*H10H 20/853* (2025.01)
*H10H 20/857* (2025.01)

(52) U.S. Cl.
CPC ...... *H01L 25/0753* (2013.01); *H01L 23/5387* (2013.01); *H10H 20/853* (2025.01); *H10H 20/857* (2025.01)

(58) Field of Classification Search
None
See application file for complete search history.

(56) References Cited

U.S. PATENT DOCUMENTS

| | | | |
|---|---|---|---|
| 9,287,341 B2* | 3/2016 | Cheon | H10K 59/353 |
| 2011/0108809 A1* | 5/2011 | Seo | H10K 59/8731 438/22 |
| 2020/0211437 A1 | 7/2020 | Ahn et al. | |
| 2020/0212117 A1* | 7/2020 | Jeon | G09F 9/301 |
| 2020/0343463 A1 | 10/2020 | Lee et al. | |
| 2022/0206619 A1* | 6/2022 | Kim | G06F 3/0412 |

FOREIGN PATENT DOCUMENTS

| | | |
|---|---|---|
| EP | 3675178 A1 | 7/2020 |
| KR | 10-2019-0092331 A | 8/2019 |
| KR | 10-2020-0079856 A | 7/2020 |
| KR | 10-2020-0081220 A | 7/2020 |
| TW | 202027267 A | 7/2020 |

* cited by examiner

*Primary Examiner* — Bo B Jang
(74) *Attorney, Agent, or Firm* — Seed IP Law Group LLP

(57) ABSTRACT

According to an aspect of the present disclosure, the display device includes: a stretchable lower substrate and a plurality of first substrates disposed on the lower substrate. The display device also includes a plurality of second substrates coupling first substrates adjacent to each other among the plurality of first substrates. The display device further includes a plurality of pixels disposed on the plurality of first substrates. The display device also includes a plurality of connection lines disposed on the plurality of second substrates and coupling the plurality of pixels. The display device further includes a protection layer disposed on each of the plurality of pixels.

18 Claims, 9 Drawing Sheets

DISPLAY DEVICE

This application claims the priority of Korean Patent Application No. 10-2020-0158267 filed on Nov. 23, 2020, in the Korean Intellectual Property Office.

BACKGROUND

Technical Field

The present disclosure relates to a display device, and more particularly, to a stretchable display device including a protection layer that protects pixels.

Description of the Related Art

Display devices employed by the monitor of a computer, a TV, a mobile phone or the like include an organic light emitting display (OLED) that emits light by itself, and a liquid crystal display (LCD) that requires a separate light source.

As the display devices have been increasingly applied to diverse fields such as a computer monitor, a TV, and a personal mobile device, display devices having a large active area and a reduced volume and weight have been studied.

Recently, a display device in which display elements, lines, etc., are formed on a flexible substrate made of flexible plastic and which can be stretched in a specific direction and manufactured in various shapes has attracted attention as a next-generation display device.

BRIEF SUMMARY

One or more embodiments of the present disclosure provide a display device which is not damaged even when stretched repeatedly.

One or more embodiments of the present disclosure provide a display device in which light extraction efficiency can be improved.

One or more embodiments of the present disclosure provide a display device in which misalignment of light emitting diodes can be suppressed.

Technical benefits or advantages of the present disclosure are not limited to the above-mentioned benefits, and other benefits, which are not mentioned above, can be clearly understood by those skilled in the art from the following descriptions.

One or more technical problems in the related art may be solved by the example features recited in the independent claims. Further features of the embodiments are given in the dependent claims.

According to an aspect of the present disclosure, the display device includes: a stretchable lower substrate and a plurality of first substrates disposed on the lower substrate. The display device also includes a plurality of second substrates connecting first substrates adjacent to each other among the plurality of first substrates. The display device further includes a plurality of pixels disposed on the plurality of first substrates. The display device also includes a plurality of connection lines disposed on the plurality of second substrates and connecting the plurality of pixels. The display device further includes a protection layer disposed on each of the plurality of pixels.

According to another aspect of the present disclosure, the display device includes: a ductile substrate that is reversibly expandable and contractible, a plurality of rigid substrates disposed to be spaced apart from each other on the ductile substrate, a plurality of pixels disposed on the plurality of rigid substrates, a plurality of connection lines disposed on the plurality of rigid substrates and connecting the plurality of pixels, a protection layer covering the plurality of pixels and a plurality of tips of the protection layer disposed outside the connection lines.

Other detailed matters of the embodiments are included in the detailed description and the drawings. The following optional features can be combined with any one of the above mentioned aspect alone or in combination.

In one or more preferred embodiments, the plurality of connection lines may be extended on the plurality of first substrates.

In one or more preferred embodiments, the protection layer may overlap the plurality of connection lines.

In one or more preferred embodiments, the plurality of connection lines may extend on the plurality of first substrates.

In one or more preferred embodiments, the protection layer may not overlap the plurality of connection lines.

In one or more preferred embodiments, the protection layer may include a plurality of patterns each having a triangular cross-section.

In one or more preferred embodiments, the plurality of pixels may include an LED that emits light and/or a bank defining the plurality of pixels.

In one or more preferred embodiments, the display device may include an upper substrate that is stretchable and may disposed on the protection layer.

In one or more preferred embodiments, there might be a contact area between the protection layer and the upper substrate.

The contact areas may be smaller than a contact area between the protection layer and the LED and the bank.

In one or more preferred embodiments, there is no step difference between an upper surface of the LED and an upper surface of the bank.

In other words, the height of the upper surface of the LED and an upper surface of the bank may be the same.

In one or more preferred embodiments, there may be a step difference between an upper surface of the LED and an upper surface of the bank.

In one or more preferred embodiments, the display device may further comprise a plurality of protrusions disposed on at least two sides of the plurality of pixels.

In one or more preferred embodiments, the plurality of protrusions may be an embossed pattern protruding from the protection layer and/or may be in contact with a side surface of the LED.

In one or more preferred embodiments, the plurality of tips may not overlap the plurality of connection lines.

In one or more preferred embodiments, the protection layer may include a plurality of prism patterns or a plurality of regular tetrahedral patterns.

In one or more preferred embodiments, the display device may further comprise a plurality of protrusions protruding downwards from the protection layer.

In one or more preferred embodiments, the plurality of protrusions may be in contact with an LED included in each of the plurality of pixels.

According to the present disclosure, when a display device is repeatedly stretched, a light emitting diode (LED) is not damaged. Thus, stretching reliability can be improved.

According to the present disclosure, light extraction efficiency is increased. Thus, the luminance of the display device can be improved.

According to the present disclosure, the LED can be transferred more precisely. Thus, the yield of the transfer process can be improved.

The effects according to the present disclosure are not limited to the contents exemplified above, and more various effects are included in the present specification.

BRIEF DESCRIPTION OF THE SEVERAL VIEWS OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
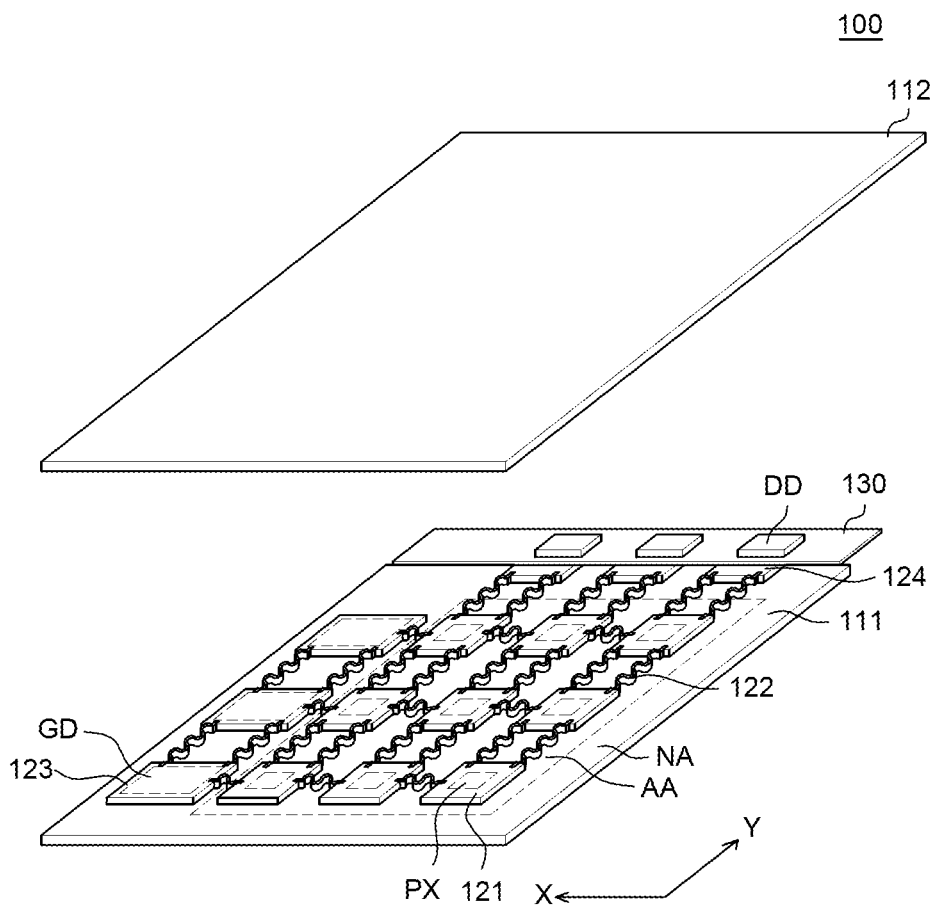
FIG. 1 is an exploded perspective view of a display device according to an embodiment of the present disclosure.

The advantages and features of the present disclosure, and methods for accomplishing the same will be more clearly understood from embodiments described below with reference to the accompanying drawings. However, the present disclosure is not limited to the following embodiments but may be implemented in various different forms. The embodiments are provided only to complete disclosure of the present disclosure and to fully provide a person with ordinary skill in the art to which the present disclosure pertains with the category of the present disclosure.

The shapes, dimensions, ratios, angles, numbers, and the like illustrated in the accompanying drawings for describing the embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only." Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly."

When an element or layer is referred to as being "on" another element or layer, it may be directly on the other element or layer, or intervening elements or layers may be present.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Throughout the whole specification, the same reference numerals denote the same elements.

Since the dimensions and thickness of each component illustrated in the drawings are represented for convenience in explanation, the present disclosure is not necessarily limited to the illustrated dimensions and thickness of each component.

The features of various embodiments of the present disclosure can be partially or entirely coupled to or combined with each other and can be interlocked and operated in technically various ways, and the embodiments can be carried out independently of or in association with each other.

Hereinafter, various embodiments of the present disclosure will be described in detail with reference to the accompanying drawings.

Display Device

A display device is capable of displaying an image even when bent or stretched and may be referred to as a stretchable display device. The display device may have higher flexibility than conventional typical display devices and may have stretchability. Thus, the display device can be freely deformed by a user's manipulation such as bending or stretching of the display device. For example, when the user seizes an end of the display device and pulls the display device, the display device may be stretched in a direction of being pulled by the user. When the user places the display device on an uneven external surface, the display device may be bent along the shape of the external surface of a wall surface. Also, when force applied by the user is removed, the display device can be restored to its original shape.

FIG. 1 is an exploded perspective view of a display device according to an embodiment of the present disclosure. Referring to FIG. 1, a display device 100 includes a lower substrate 111, an upper substrate 112, a plurality of first substrates 121, a plurality of second substrates 122, a plurality of third substrates 123, 124 and a printed circuit board 130. Also, the display device 100 includes a plurality of pixels PX, a gate driver GD and a data driver DD.

The lower substrate 111 is a substrate for supporting and protecting various components of the display device 100. Further, the upper substrate 112 is a substrate for covering and protecting various components of the display device 100.

Each of the lower substrate 111 and the upper substrate 112 is a ductile substrate. It is made of a bendable or stretchable insulating material. For example, each of the lower substrate 111 and the upper substrate 112 may be made of silicone rubber such as polydimethylsiloxane (PDMS)

and an elastomer such as polyurethane (PU), polytetrafluoroethylene (PTFE) or the like. Each of the lower substrate 111 and the upper substrate 112 may have flexible properties. Further, the lower substrate 111 and the upper substrate 112 may be made of the same material, but are not limited thereto and could be made of different materials.

Each of the lower substrate 111 and the upper substrate 112 is a ductile substrate and may be reversibly expandable and contractible. Thus, the lower substrate 111 may also be referred to as a lower ductile substrate or a first ductile substrate.

The upper substrate 112 may also be referred to as an upper ductile substrate or a second ductile substrate.

The lower substrate 111 and the upper substrate 112 may have a modulus of elasticity in the range of several to hundreds of MPa.

The lower substrate 111 and the upper substrate 112 may have a ductile breaking rate of 100% or more. Herein, the ductile breaking rate refers to an extension distance when an object to be stretched is broken or cracked.

The lower substrate may have a thickness of 10 µm to 1 mm, but is not limited thereto.

The lower substrate 111 may have an active area AA and a non-active area NA surrounding the active area AA.

The active area AA is an area where an image is displayed on the display device 100. The plurality of pixels PX is disposed in the active area AA.

Each pixel PX may include a display element and various driving elements for driving the display element. The various driving elements may refer to at least one thin film transistor (TFT) and a capacitor, but are not limited thereto. Each of the plurality of pixels PX may be connected to various lines. For example, each of the plurality of pixels PX may be connected to various lines such as a gate line, a data line, a high-potential power line, a low-potential power line and a reference voltage line.

A protection layer may be disposed on each of the pixels PX to protect each pixel PX.

The non-active area NA is an area where an image is not displayed. The non-active area NA may be an area disposed adjacent to the active area AA and at least partly or fully surrounding the active area AA, but is not limited thereto. The non-active area NA is an area of the lower substrate 111 except the active area AA. It may be transformed and separated in various shapes. In the non-active area NA, driving elements for driving the plurality of pixels PX disposed in the active area AA may be disposed. In the non-active area NA, the gate driver GD including on ero more chips may be disposed. Further, in the non-active area NA, a plurality of pads connected to the gate driver GD and/or the data driver DD may be disposed. Each of the pads may be connected to one or more of the plurality of pixels PX disposed in the active area AA.

On the lower substrate 111, the plurality of first substrates 121, the plurality of second substrates 122 and the plurality of third substrates 123, 124 are disposed.

The plurality of first substrates 121 is disposed in the active area AA of the lower substrate 111, and the plurality of pixels PX is disposed on the plurality of first substrates 121. So, each of the plurality of first substrates 121 may include one or more pixels PX. Further, the plurality of third substrates 123, 124 is disposed in the non-active area NA of the lower substrate 111. The gate driver GD and/or the plurality of pads are formed on the plurality of third substrates 123, 124.

As shown in FIG. 1, the gate driver GD may be mounted on a third substrate 123 located on one side of an X-axis direction of the active area AA among the plurality of third substrates 123, 124. The gate driver GD may be formed on the third substrate 123 in a gate in panel (GIP) manner when various components on a first substrate 121 are fabricated. Accordingly, various circuit components constituting the gate driver GD, such as various transistors, capacitors, lines and the like, may be disposed on the plurality of third substrates 123, 124. However, the present disclosure is not limited thereto. The gate driver GD may be mounted in a chip on film (COF) manner. Also, the plurality of third substrates 123, 124 may be disposed in the non-active area NA located on the other side of the X-axis direction of the active area AA. The gate drivers GD may also be mounted on the plurality of third substrates 123, 124 located on the other side of the X-axis direction of the active area AA.

Referring to FIG. 1, the plurality of third substrates 123, 124 may be greater in size than the plurality of first substrates 121. Specifically, each of the plurality of third substrates 123, 124 may be greater in size than each of the plurality of first substrates 121. As described above, the gate driver GD may be disposed on each of the plurality of third substrates 123, 124. For example, one stage of the gate driver GD may be disposed on each of the plurality of third substrates 123, 124. Accordingly, the area of various circuit components constituting one stage of the gate driver GD is relatively greater than the area of a first substrate 121 on which a pixel PX is disposed. Therefore, each of the plurality of third substrates 123, 124 may be greater in size than each of the plurality of first substrates 121.

FIG. 1 illustrates that the plurality of third substrates 124 is disposed on one side of a Y-axis direction and third substrates 123 one side of the X-axis direction in the non-active area NA. However, the present disclosure is not limited thereto. The plurality of third substrates 123, 124 may be disposed in any portion of the non-active area NA. Also, FIG. 1 illustrates that each of the plurality of first substrates 121 and the plurality of third substrates 123, 124 has a quadrangular shape. However, the present disclosure is not limited thereto. Each of the plurality of first substrates 121 and/or the plurality of third substrates 123, 124 may have various shapes.

Each of the plurality of second substrates 122 connects first substrates 121 adjacent to each other, third substrates 123 adjacent to each other, or a first substrate 121 and a third substrate 123, 124 adjacent to each other. Thus, each of the plurality of second substrates 122 may also be referred to as a connection substrate. That is, the plurality of second substrates 122 is disposed between the plurality of first substrates 121, between the plurality of third substrates 123, 124, or between the plurality of first substrates 121 and the plurality of third substrates 123, 124.

The distance between the adjacent first substrates 121 may be larger or the same than the dimension of the first substrate 121 in the same direction X or Y.

Referring to FIG. 1, the plurality of second substrates 122 has a curved shape. For example, the plurality of second substrates 122 may have a sine wave shape. However, the shape of the plurality of second substrates 122 is not limited thereto. The plurality of second substrates 122 may have various shapes. For example, the plurality of second substrates 122 may be extended in a zigzag manner, or a plurality of diamond-shaped substrates may be extended by being connected to each other at their vertices. The number and shape of the plurality of second substrates 122 shown in FIG. 1 are provided by way of example. The number and shape of the plurality of second substrates 122 may vary depending on the design.

The plurality of first substrates 121, the plurality of second substrates 122 and the plurality of third substrates 123, 124 are rigid substrates. That is, the plurality of first substrates 121, the plurality of second substrates 122 and the plurality of third substrates 123, 124 are more rigid than the lower substrate 111 and/or the upper substrate. The plurality of first substrates 121, the plurality of second substrates 122 and the plurality of third substrates 123, 124 may be higher in modulus of elasticity than the lower substrate 111. The modulus of elasticity is a parameter showing the ratio of deformation of a substrate caused by a stress applied to the substrate, and when the modulus of elasticity is relatively high, the hardness may be relatively high. Thus, a first substrate 121, a second substrate 122 and a third substrate 123 may also be referred to as a first rigid substrate, a second rigid substrate and a third rigid substrate, respectively. The modulus of elasticity of the plurality of first substrates 121, the plurality of second substrates 122 and the plurality of third substrates 123, 124 may be 1000 times or more higher than that of the lower substrate 111, but is not limited thereto.

The plurality of first substrates 121, the plurality of second substrates 122 and the plurality of third substrates 123, 124 which are rigid substrates may be made of a plastic material having less flexibility than the lower substrate 111. For example, the plurality of first substrates 121, the plurality of second substrates 122 and the plurality of third substrates 123, 124 may be made of polyimide (PI), polyacrylate, polyacetate or the like. Here, the plurality of first substrates 121 and the plurality of third substrates 123, 124 may be made of the same material, but are not limited thereto. The plurality of first substrates 121 and the plurality of third substrates 123, 124 may also be made of different materials from each other.

In some embodiments, the lower substrate 111 may be defined as including a plurality of first lower patterns and a second lower pattern. The plurality of first lower patterns may be disposed in an area of the lower substrate 111 which overlaps the plurality of first substrates 121 and the plurality of third substrates 123, 124. Also, the second lower pattern may be disposed in an area excluding the area where the plurality of first substrates 121 and the plurality of third substrates 123, 124 are disposed. Otherwise, the second lower pattern may be disposed in the entire area of the display device 100.

In this case, the plurality of first lower patterns may have a higher modulus of elasticity than the second lower pattern. For example, the plurality of first lower patterns may be made of the same material as the plurality of first substrates 121 and the plurality of third substrates 123, 124. Also, the second lower pattern may be made of a material having a lower modulus of elasticity than the plurality of first substrates 121 and the plurality of third substrates 123, 124. Thus, the first and the second lower patterns might be used to reinforce the substrate or to adapt the flexibility of the substrate.

That is, the first lower patterns may be made of polyimide (PI), polyacrylate, polyacetate or the like. The second lower pattern may be made of silicone rubber such as polydimethylsiloxane (PDMS) and an elastomer such as polyurethane (PU), polytetrafluoroethylene (PTFE) or the like.

The gate driver GD is a component for supplying a gate voltage to the plurality of pixels PX disposed in the active area AA. The gate driver GD includes a plurality of stages formed on the plurality of third substrates 123, 124. The stages of the gate driver GD may be electrically connected to each other. Therefore, a gate voltage output from one stage may be transferred to another stage. Also, each stage may sequentially supply a gate voltage to the plurality of pixels PX connected to the stage.

A power supply may be connected to the gate driver GD and may supply a gate driving voltage and a gate clock voltage to the gate driver GD. Further, the power supply may be connected to the plurality of pixels PX and may supply a pixel driving voltage to each of the plurality of pixels PX. That is, the power supply may also be formed on the plurality of third substrates 123, 124. The power supply may be formed adjacent to the gate driver GD on an outer substrate (not illustrated). Furthermore, power supplies formed on the plurality of third substrates 123, 124 may be electrically connected to each other. That is, a plurality of power supplies formed on the plurality of third substrates 123, 124 may be connected by a gate power connection line and a pixel power connection line. Thus, each of the plurality of power supplies may supply a gate driving voltage, a gate clock voltage and a pixel driving voltage.

The printed circuit board 130 is configured to transfer a signal and voltage for driving a display element from a controller to the display element. Thus, the printed circuit board 130 may also be referred to as a driving substrate. On the printed circuit board 130, the controller such as an IC chip, a circuit or the like may be mounted. Further, on the printed circuit board 130, a memory, a processor or the like may also be mounted. The printed circuit board 130 provided in the display device 100 may include a stretchable area and a non-stretchable area to secure stretchability. Also, on the non-stretchable area, an IC chip, a circuit, a memory, a processor or the like may be mounted. Further, in the stretchable area, lines electrically connected to the IC chip, the circuit, the memory and the processor may be disposed. Furthermore, the printed circuit board 130 may be bonded to the plurality of pads of the plurality of third substrates 123, 124 disposed in the non-active area NA.

The data driver DD is a component that supplies a data voltage to the plurality of pixels PX disposed in the active area AA. The data driver DD may be configured as an IC chip and thus may also be referred to as a data integrated circuit (D-IC). Also, the data driver DD may be provided in the non-stretchable area of the printed circuit board 130. That is, the data driver DD may be mounted on the printed circuit board 130 in a chip on board (COB) manner. Further, the data driver DD supplies a data voltage or the like to each of the plurality of pixels PX disposed in the active area AA through the plurality of pads disposed on the plurality of third substrates 123, 124. FIG. 1 illustrates that the data driver DD is mounted in the COB manner. However, the present disclosure is not limited thereto. The data driver DD may be mounted in the COF manner, the COG manner or a tape carrier package (TCP) manner.

Also, FIG. 1 illustrates that a third substrate 124 is disposed in the non-active area AA on an upper side of the active area AA so as to correspond to a first substrate 121 disposed on a row in the active area AA. Further, FIG. 1 illustrates that a data driver DD is disposed on the printed circuit board 130 being connected to a third substrate 124. However, the present disclosure is not limited thereto. That is, a third substrate 124 and a data driver DD may be disposed so as to correspond to first substrates 121 disposed on a plurality of rows.

Hereinafter, the active area AA of the display device 100 according to an embodiment of the present disclosure will be described in more detail with reference to FIG. 2 and FIG. 3.

Planar and Cross-Sectional Structures of Active Area

Figure 2:
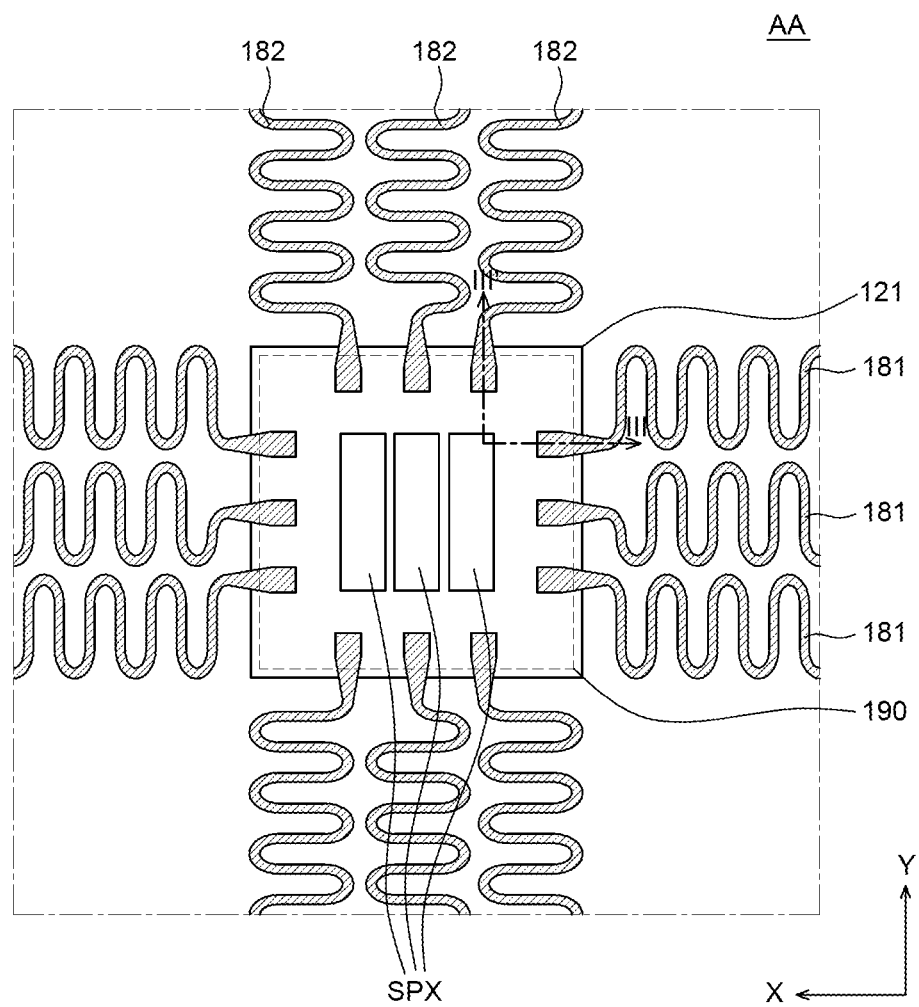
FIG. 2 is an enlarged plan view of an active area of the display device according to an embodiment of the present disclosure.

FIG. 2 is an enlarged plan view of an active area of the display device according to an embodiment of the present disclosure. FIG. 3 is a schematic cross-sectional view as taken along a line III-III' of FIG. 2. For the convenience of description, FIG. 1 will also be referred to hereinafter.

Referring to FIG. 1 and FIG. 2, the plurality of first substrates 121 is disposed on the lower substrate 111 in the active area AA. The plurality of first substrates 121 is disposed to be spaced apart from each other on the lower substrate 111. For example, the plurality of first substrates 121 may be disposed in a matrix form on the lower substrate 111 as shown in FIG. 1, but is not limited thereto.

Figure 3:
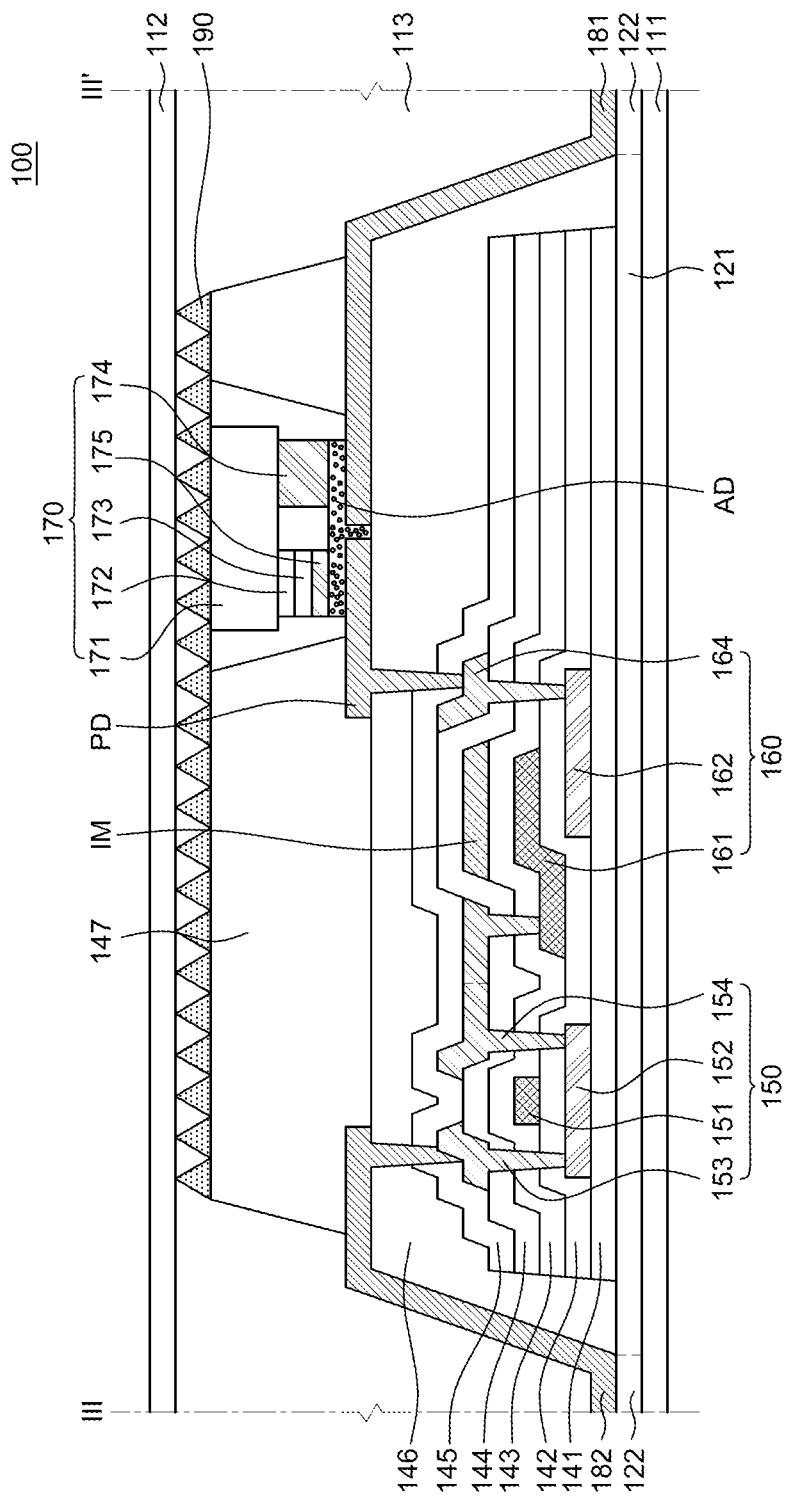
FIG. 3 is a schematic cross-sectional view as taken along a line of FIG. 2.

Referring to FIG. 2 and FIG. 3, a pixel including a plurality of sub-pixels SPX is disposed on the first substrate 121. Also, each of the sub-pixels SPX may include an LED 170, which is a display element and a driving transistor 160 and a switching transistor 150 for driving the LED 170. However, a display element in each sub-pixel SPX is not limited to the LED 170 and may be an organic light emitting diode. Further, the plurality of sub-pixels SPX may include a red sub-pixel, a green sub-pixel and a blue sub-pixel, but is not limited thereto. The plurality of sub-pixels SPX may include various color pixels as needed (e.g., white color).

The plurality of sub-pixels SPX may be connected to a plurality of connection lines 180. The plurality of sub-pixels SPX may be electrically connected to first connection lines 181 extended in the X-axis direction. Also, the plurality of sub-pixels SPX may be electrically connected to second connection lines 182 extended in the Y-axis direction.

Further, a protection layer 190 may be disposed on the pixel PX including the plurality of sub-pixels SPX to cover the pixel PX including the plurality of sub-pixels SPX. Specifically, as shown in FIG. 2, the protection layer 190 overlaps the plurality of sub-pixels SPX and may also overlap the plurality of connection lines 180 extended on the first substrate 121. Furthermore, a shape of the protection layer 190 is illustrated as a quadrangular pattern which is the same as a shape of the first substrate 121, but is not limited thereto. The protection layer 190 may have various shapes on the first substrate 121.

Hereinafter, a cross-sectional structure of the display area will be described in detail with reference to FIG. 3.

Referring to FIG. 3, a plurality of inorganic insulating layers is disposed on the plurality of first substrates 121. For example, the plurality of inorganic insulating layers may include a buffer layer 141, a gate insulating layer 142, a first interlayer insulating layer 143, a second interlayer insulating layer 144 and a passivation layer 145. However, the present disclosure is not limited thereto. Various inorganic insulating layers may be disposed on the plurality of first substrates 121. One or more of the buffer layer 141, the gate insulating layer 142, the first interlayer insulating layer 143, the second interlayer insulating layer 144 and the passivation layer 145 may be omitted.

Specifically, the buffer layer 141 is disposed on the plurality of first substrates 121. The buffer layer 141 is formed on the plurality of first substrates 121 to protect various components of the display device 100 against permeation of moisture ($H_2O$) and oxygen ($O_2$) from the outside of the lower substrate 111 and the plurality of first substrates 121. The buffer layer 141 may be made of an insulating material. For example, the buffer layer 141 may be formed as a single layer or a plurality of layers of at least one of silicon nitride (SiNx), silicon oxide (SiOx) and silicon oxynitride (SiON). However, the buffer layer 141 may be omitted depending on the structure or characteristics of the display device 100.

In this case, the buffer layer 141 may be formed only in an area where the buffer layer 141 overlaps the plurality of first substrates 121 and/or the plurality of third substrates 123, 124. As described above, the buffer layer 141 may be made of an inorganic material. Thus, the buffer layer 141 may be easily damaged, such as easily cracked, while the display device 100 is stretched. Therefore, the buffer layer 141 may not be formed in areas between the plurality of first substrates 121 and the plurality of third substrates 123, 124. The buffer layer 141 may be patterned into the shapes of the plurality of first substrates 121 and the plurality of third substrates 123, 124 and formed only on upper portions of the plurality of first substrates 121 and/or the plurality of third substrates 123, 124. Accordingly, in the display device 100 according to an embodiment of the present disclosure, the buffer layer 141 is formed only in the area where the buffer layer 141 overlaps the plurality of first substrates 121 and/or the plurality of third substrates 123, 124 which are rigid substrates. Thus, it is possible to suppress damage to the buffer layer 141 even when the display device 100 is deformed, such as bent or stretched e.g., the buffer layer 141 is formed only in the area of the rigid first and/or third substrates 121, 123.

Referring to FIG. 3, the switching transistor 150 including a gate electrode 151, an active layer 152, a source electrode 153 and a drain electrode 154 is formed on the buffer layer 141. Also, the driving transistor 160 including a gate electrode 161, an active layer 162, a source electrode and a drain electrode 164 is formed on the buffer layer 141.

Referring to FIG. 3, the active layer 152 of the switching transistor 150 and the active layer 162 of the driving transistor 160 are disposed on the buffer layer 141. For example, each of the active layer 152 of the switching transistor 150 and the active layer 162 of the driving transistor 160 may be made of an oxide semiconductor. Alternatively, each of the active layer 152 of the switching transistor 150 and the active layer 162 of the driving transistor 160 may be made of amorphous silicon (a-Si), polycrystalline silicon (poly-Si), an organic semiconductor or the like.

The gate insulating layer 142 is disposed on the active layer 152 of the switching transistor 150 and the active layer 162 of the driving transistor 160. The gate insulating layer 142 is configured to electrically insulate the gate electrode 151 of the switching transistor 150 from the active layer 152 of the switching transistor 150 and electrically insulate the gate electrode 161 of the driving transistor 160 from the active layer 162 of the driving transistor 160. Further, the gate insulating layer 142 may be made of an insulating material. For example, the gate insulating layer 142 may be formed as a single inorganic layer or a plurality of inorganic layers of silicon nitride (SiNx) or silicon oxide (SiOx), but is not limited thereto.

The gate electrode 151 of the switching transistor 150 and the gate electrode 161 of the driving transistor 160 are disposed on the gate insulating layer 142. The gate electrode 151 of the switching transistor 150 and the gate electrode 161 of the driving transistor 160 are disposed to be spaced apart from each other on the gate insulating layer 142. Further, the gate electrode 151 of the switching transistor 150 overlaps the active layer 152 of the switching transistor 150. The gate electrode 161 of the driving transistor 160 overlaps the active layer 162 of the driving transistor 160.

Each of the gate electrode 151 of the switching transistor 150 and the gate electrode 161 of the driving transistor 160 may be made of any one of various metal materials, for example, any one of molybdenum (Mo), aluminum (Al), chromium (Cr), gold (Au), titanium (Ti), nickel (Ni), neodymium (Nd) and copper (Cu). Alternatively, each of the gate electrode 151 of the switching transistor 150 and the gate electrode 161 of the driving transistor 160 may be made of an alloy of two or more of them, or a plurality of layer thereof, but is not limited thereto.

The first interlayer insulating layer 143 is disposed on the gate electrode 151 of the switching transistor 150 and the gate electrode 161 of the driving transistor 160. The first interlayer insulating layer 143 insulates the gate electrode 161 of the driving transistor 160 from an intermediate metal layer IM. The first interlayer insulating layer 143 may also be made of an inorganic material like the buffer layer 141. For example, the first interlayer insulating layer 143 may be formed as a single inorganic layer or a plurality of inorganic layers of silicon nitride (SiNx) or silicon oxide (SiOx), but is not limited thereto.

The intermediate metal layer IM is disposed on the first interlayer insulating layer 143. Further, the intermediate metal layer IM overlaps the gate electrode 161 of the driving transistor 160. Thus, a storage capacitor is formed in an area where the intermediate metal layer IM overlaps the gate electrode 161 of the driving transistor 160. Specifically, the gate electrode 161 of the driving transistor 160, the first interlayer insulating layer 143 and the intermediate metal layer IM form the storage capacitor. However, the position of the intermediate metal layer IM is not limited thereto. The intermediate metal layer IM may overlap another electrode to form a storage capacitor in various ways.

The intermediate metal layer IM may be made of any one of various metal materials, for example, any one of molybdenum (Mo), aluminum (Al), chromium (Cr), gold (Au), titanium (Ti), nickel (Ni), neodymium (Nd) and copper (Cu). Alternatively, the intermediate metal layer IM may be made of an alloy of two or more of them, or a plurality of layer thereof, but is not limited thereto.

The second interlayer insulating layer 144 is disposed on the intermediate metal layer IM. The second interlayer insulating layer 144 insulates the gate electrode 151 of the switching transistor 150 from the source electrode 153 and the drain electrode 154 of the switching transistor 150. Also, the second interlayer insulating layer 144 insulates the intermediate metal layer IM from the source electrode and the drain electrode 164 of the driving transistor 160. The second interlayer insulating layer 144 may also be made of an inorganic material like the buffer layer 141. For example, the first interlayer insulating layer 143 may be formed as a single inorganic layer or a plurality of inorganic layers of silicon nitride (SiNx) or silicon oxide (SiOx), but is not limited thereto.

The source electrode 153 and the drain electrode 154 of the switching transistor 150 are disposed on the second interlayer insulating layer 144. Also, the source electrode and the drain electrode 164 of the driving transistor 160 are disposed on the second interlayer insulating layer 144. The source electrode 153 and the drain electrode 154 of the switching transistor 150 are disposed to be spaced apart from each other on the same layer. Although FIG. 3 does not illustrate the source electrode of the driving transistor 160, the source electrode and the drain electrode 164 of the driving transistor 160 are also disposed to be spaced apart from each other on the same layer. In the switching transistor 150, the source electrode 153 and the drain electrode 154 may be electrically connected to the active layer 152 to be in contact with the active layer 152. Also, in the driving transistor 160, the source electrode and the drain electrode 164 may be electrically connected to the active layer 162 to be in contact with the active layer 162. Further, the drain electrode 154 of the switching transistor 150 may be electrically connected to the gate electrode 161 of the driving transistor 160 to be in contact with the gate electrode 161 of the driving transistor 160.

The source electrode 153 and the drain electrodes 154 and 164 may be made of any one of various metal materials, for example, any one of molybdenum (Mo), aluminum (Al), chromium (Cr), gold (Au), titanium (Ti), nickel (Ni), neodymium (Nd) and copper (Cu). Alternatively, the source electrode 153 and the drain electrodes 154 and 164 may be made of an alloy of two or more of them, or a plurality of layer thereof, but are not limited thereto.

In the present disclosure, the driving transistor 160 has been described as having a coplanar structure, but various types of transistor having a staggered structure or the like may also be used.

Although not shown in FIG. 3, a gate pad and a data pad may be disposed on the second interlayer insulating layer 144. The gate pad serves to transfer a gate voltage to the plurality of sub-pixels SPX. The gate voltage may be transferred from the gate pad to the gate electrode 151 of the switching transistor 150 through a gate line formed on the first substrate 121. The data pad serves to transfer a data voltage to the plurality of sub-pixels SPX. The data voltage may be transferred from the data pad to the source electrode 153 of the switching transistor 150 through a data line formed on the first substrate 121. The gate pad and the data pad may be made of the same material as the source electrode 153 and the drain electrodes 154 and 164, but are not limited thereto.

Referring to FIG. 3, the passivation layer 145 is formed on the switching transistor 150 and the driving transistor 160. That is, the passivation layer 145 covers the switching transistor 150 and the driving transistor 160 to protect the switching transistor 150 and the driving transistor 160 against permeation of moisture and oxygen. The passivation layer 145 may be made of an inorganic material and formed as a single layer or a plurality of layers, but is not limited thereto.

Any or all of the gate insulating layer 142, the first interlayer insulating layer 143, the second interlayer insulating layer 144 and the passivation layer 145 may be patterned and formed only in an area where they overlap the plurality of first substrates 121. The gate insulating layer 142, the first interlayer insulating layer 143, the second interlayer insulating layer 144 and the passivation layer 145 may also be made of an inorganic material like the buffer layer 141. Thus, the gate insulating layer 142, the first interlayer insulating layer 143, the second interlayer insulating layer 144 and the passivation layer 145 may be easily damaged, such as easily cracked, while the display device 100 is stretched. Therefore, the gate insulating layer 142, the first interlayer insulating layer 143, the second interlayer insulating layer 144 and the passivation layer 145 may not be formed in areas between the plurality of first substrates 121 or outside of the first substrates 121. The gate insulating layer 142, the first interlayer insulating layer 143, the second interlayer insulating layer 144 and the passivation layer 145 may be patterned into the shapes of the plurality of first substrates 121 and formed only on upper portions of the plurality of first substrates 121.

A planarization layer 146 is formed on the passivation layer 145. The planarization layer 146 serves to flatten upper portions of the switching transistor 150 and the driving transistor 160. The planarization layer 146 may be formed as a single layer or a plurality of layers and may be made of an organic material. Thus, the planarization layer 146 may also be referred to as an organic insulating layer. For example, the planarization layer 146 may be made of an acrylic organic material, but is not limited thereto.

Referring to FIG. 3, the planarization layer 146 is disposed on the plurality of first substrates 121 so as to cover upper surfaces and side surfaces of the buffer layer 141, the gate insulating layer 142, the first interlayer insulating layer 143, the second interlayer insulating layer 144 and the passivation layer 145. Further, the planarization layer 146 surrounds the buffer layer 141, the gate insulating layer 142, the first interlayer insulating layer 143, the second interlayer insulating layer 144 and the passivation layer 145 together with the plurality of first substrates 121. Specifically, the planarization layer 146 may be disposed to cover an upper surface and a side surface of the passivation layer 145, a side surface of the first interlayer insulating layer 143, a side surface of the second interlayer insulating layer 144, a side surface of the gate insulating layer 142, a side surface of the buffer layer 141 and a part of upper surfaces of the plurality of first substrates 121. Thus, the planarization layer 146 may compensate for steps between the side surfaces of the buffer layer 141, the gate insulating layer 142, the first interlayer insulating layer 143, the second interlayer insulating layer 144 and the passivation layer 145. Also, the planarization layer 146 may enhance adhesion strength between the planarization layer 146 and the connection lines 180 disposed on a side surface of the planarization layer 146.

Referring to FIG. 3, an incline angle of the side surface of the planarization layer 146 may be smaller than those of the side surfaces of the buffer layer 141, the gate insulating layer 142, the first interlayer insulating layer 143, the second interlayer insulating layer 144 and the passivation layer 145. For example, the side surface of the planarization layer 146 may have a smaller incline than the side surface of the passivation layer 145, the side surface of the first interlayer insulating layer 143, the side surface of the second interlayer insulating layer 144, the side surface of the gate insulating layer 142 and the side surface of the buffer layer 141. Thus, the connection lines 180 in contact with the side surface of the planarization layer 146 are disposed to have a small incline. Therefore, when the display device 100 is stretched, a stress generated in the connection lines 180 can be reduced. Also, it is possible to suppress cracks in the connection lines 180 or peeling of the connection lines 180 from the side surface of the planarization layer 146.

Referring to FIG. 2 and FIG. 3, the connection lines 180 refer to lines that electrically connect the pads disposed on the plurality of first substrates 121. The connection lines 180 are disposed on the plurality of second substrates 122. Also, the connection lines 180 may also be connected on the plurality of first substrates 121 to be electrically connected to the pads disposed on the plurality of first substrates 121. The pads disposed on the first substrates 121 refer to the gate and data pads.

The connection lines 180 include the first connection lines 181 and the second connection lines 182. The first connection lines 181 and the second connection lines 182 are disposed between the plurality of first substrates 121. Specifically, the first connection lines 181 refer to lines extended in the X-axis direction between the plurality of first substrates 121 among the connection lines 180. The second connection lines 182 refer to lines extended in the Y-axis direction between the plurality of first substrates 121 among the connection lines 180.

The connection lines 180 may be made of a metal material such as copper (Cu), aluminum (Al), titanium (Ti) or molybdenum (Mo). Otherwise, the connection lines 180 may have a laminated structure of metal materials such as copper/molybdenum-titanium (Cu/MoTi), titanium/aluminum/titanium (Ti/Al/Ti) or the like, but are not limited thereto.

In a general display device, various lines such as a plurality of gate lines and a plurality of data lines are extended in straight lines and are disposed between a plurality of sub-pixels. Also, the plurality of sub-pixels is connected to a single signal line. Therefore, in the general display device, various lines such as a gate line, a data line, a high-potential power line and a reference voltage line are continuously extended on a substrate from one side to the other side of an organic light emitting display device.

Unlike this, in the display device 100 according to an embodiment of the present disclosure, various lines such, as a gate line, a data line, a high-potential power line and a reference voltage line which are formed in straight lines and considered to be used in the general organic light emitting display device, are disposed only on the plurality of first substrates 121 and the plurality of third substrates 123, 124. That is, in the display device 100 according to an embodiment of the present disclosure, lines formed in straight lines are disposed only on the plurality of first substrates 121 and the plurality of third substrates 123, 124.

In the display device 100 according to an embodiment of the present disclosure, the pads on two adjacent first substrates 121 or two adjacent third substrate 123 may be connected by the connection lines 180 to connect discontinuous lines on the first substrates 121 or the third substrates 123. That is, the connection lines 180 electrically connect the pads on the two adjacent first substrates 121, the two adjacent third substrate 123 and the first substrate 121 and the third substrate 123 adjacent to each other. Therefore, the display device 100 according to an embodiment of the present disclosure may include the plurality of connection lines 180 to electrically connect various lines, such as a gate line, a data line, a high-potential power line and a reference voltage line, between the plurality of first substrates 121, between the plurality of third substrates 123, 124 and between the plurality of first substrates 121 and the plurality of third substrates 123, 124. For example, gate lines may be disposed on the plurality of first substrates 121 disposed adjacent to each other in the X-axis direction. Also, the gate pads may be disposed on both ends of the gate lines. In this case, a plurality of gate pads on the plurality of first substrates 121 disposed adjacent to each other in the X-axis direction may be connected to each other by the first connection lines 181 serving as the gate lines. Therefore, the gate lines disposed on the plurality of first substrates 121 and the first connection lines 181 disposed on the third substrates 123 may serve as a single gate line. Further, lines, such as a light emission signal line, a low-potential power line and a high-potential power line which are extended in the X-axis direction among all of various lines that can be included in the display device 100, may also be electrically connected by the first connection lines 181 as described above.

Referring to FIG. 2 and FIG. 3, the first connection lines 181 may connect pads on two first substrates 121 disposed side by side among the pads on the plurality of first substrates 121 disposed adjacent to each other in the X-axis direction. Each first connection line 181 may serve as a gate line, a light emission signal line, a high-potential power line, or a low-potential power line, but is not limited thereto. For example, the first connection lines 181 may serve as gate lines and electrically connect the gate pads on the two first substrates 121 disposed side by side in the X-axis direction. Therefore, as described above, the gate pads on the plurality of first substrates 121 disposed in the X-axis direction may be connected by the first connection lines 181 serving as the gate lines. A single gate voltage may be transferred to the gate pads.

The second connection lines 182 may connect the pads on two first substrates 121 disposed side by side among the pads on the plurality of first substrates 121 disposed adjacent to each other in the Y-axis direction. Each second connection line 182 may serve as a data line, a high-potential power line, a low-potential power line or a reference voltage line, but is not limited thereto. For example, the second connection lines 182 may serve as data lines and electrically connect data lines on two first substrates 121 disposed side by side in the Y-axis direction. Therefore, as described above, internal lines on the plurality of first substrates 121 disposed in the Y-axis direction may be connected by a plurality of second connection lines 182 serving as the data lines. A single data voltage may be transferred to the data lines.

Referring to FIG. 1, the connection lines 180 may further include third connection lines that connect the pads on the plurality of first substrates 121 and the plurality of third substrates 123, 124 or connect pads on two third substrates 123 disposed side by side among the pads on the plurality of third substrates 123, 124 disposed adjacent to each other in the Y-axis direction.

As shown in FIG. 3, each first connection line 181 may be in contact with an upper surface and the side surface of the planarization layer 146 disposed on the first substrate 121 and may be extended to an upper surface of the second substrate 122. Also, each second connection line 182 may be in contact with the upper surface and the side surface of the planarization layer 146 disposed on the first substrate 121 and may be extended to the upper surface of the second substrate 122.

Referring to FIG. 3, a bank 147 is formed on a connection pad PD, the connection lines 180 and the planarization layer 146. The bank 147 is a component to distinguish or separate adjacent sub-pixels SPX. The bank 147 is disposed to cover at least a part of the connection pad PD, the connection lines 180 and the planarization layer 146. The bank 147 may be made of an insulating material. Further, the bank 147 may contain a black material. Since the bank 147 contains a black material, the bank 147 serves to hide lines which are visible through the active area AA. The bank 147 may be made of, for example, a transparent carbon-based mixture. Specifically, the bank 147 may contain carbon black, but is not limited thereto. The bank 147 may also be made of a transparent insulating material. Further, although FIG. 3 illustrates that the bank 147 has the same height as the LED 170, the present disclosure is not limited thereto. The bank 147 may have a lower height than the LED 170.

Referring to FIG. 3, the LED 170 is disposed on the connection pad PD and the first connection lines 181. The LED 170 includes an n-type layer 171, an active layer 172, a p-type layer 173, an n-electrode 174 and a p-electrode 175. The LED 170 of the display device 100 according to an embodiment of the present disclosure has a flip-chip structure in which the n-electrode 174 and the p-electrode 175 are formed on one surface thereof.

The n-type layer 171 may be formed by injecting n-type impurities into gallium nitride (GaN) having excellent crystallinity. The n-type layer 171 may be disposed on a separate base substrate which is made of a light emitting material.

The active layer 172 is disposed on the n-type layer 171. The active layer 172 is a light emitting layer that emits light in the LED 170 and may be made of a nitride semiconductor, for example, indium gallium nitride (InGaN). The p-type layer 173 is disposed on the active layer 172. The p-type layer 173 may be formed by injecting p-type impurities into gallium nitride (GaN).

As described above, the LED 170 according to an embodiment of the present disclosure is manufactured by sequentially laminating the n-type layer 171, the active layer 172, and the p-type layer 173, and then, etching a predetermined area of the layers to thereby form the n-electrode 174 and the p-electrode 175. In this case, the predetermined area is a space to separate the n-electrode 174 and the p-electrode 175 from each other and is etched to expose a part of the n-type layer 171. In other words, a surface of the LED 170 on which the n-electrode 174 and the p-electrode 175 are to be disposed may not be flat and may have different levels of height.

The n-electrode 174 is disposed on the etched area, and the n-electrode 174 may be made of a conductive material. Further, the p-electrode 175 is disposed on a non-etched area, and the p-electrode 175 may also be made of a conductive material. For example, the n-electrode 174 is be disposed on the n-type layer 171 which is exposed by etching and the p-electrode 175 is disposed on the p-type layer 173. The p-electrode 175 may be made of the same material as the n-electrode 174.

An adhesive layer AD is disposed on upper surfaces of the connection pad PD and the first connection lines 181 and between the connection pad PD and the first connection lines 181. Thus, the LED 170 can be bonded onto the connection pad PD and the first connection lines 181. In this case, the n-electrode 174 may be disposed on the first connection lines 181 and the p-electrode 175 may be disposed on the connection pad PD.

The adhesive layer AD may be a conductive adhesive layer formed by dispersing conductive balls in an insulating base member. Thus, when heat or pressure is applied to the adhesive layer AD, the conductive balls are electrically connected to have conductive properties in a portion of the adhesive layer AD to which heat or pressure is applied. An area of the adhesive layer AD to which pressure is not applied may have insulating properties. For example, the n-electrode 174 is electrically connected to the first connection lines 181 through the adhesive layer AD, and the p-electrode 175 is electrically connected to the connection pad PD through the adhesive layer AD. After applying the adhesive layer AD to upper surfaces of the first connection lines 181 and the connection pad PD by an inkjet method or the like, the LED 170 may be transferred onto the adhesive layer AD. Then, the LED 170 may be pressed and heated to thereby electrically connect the connection pad PD to the p-electrode 175 and the first connection lines 181 to the n-electrode 174. However, other portions of the adhesive layer AD excluding a portion of the adhesive layer AD between the n-electrode 174 and first connection lines 181 and a portion of the adhesive layer AD between the p-electrode 175 and the connection pad PD have insulating properties. Meanwhile, the adhesive layer AD may be separately disposed on each of the connection pad PD and the first connection lines 181.

Further, the connection pad PD is electrically connected to the drain electrode 164 of the driving transistor 160 and receives a driving voltage for driving the LED 170 from the driving transistor 160. Furthermore, a low-potential driving voltage for driving the LED 170 is applied to the first connection lines 181. Thus, when the display device 100 is turned on, different levels of voltage applied to each of the connection pad PD and the first connection lines 181 are transferred to the n-electrode 174 and the p-electrode 175. Accordingly, the LED 170 emits light.

Referring to FIG. 3, the protection layer 190 is disposed on the bank 147 and the LED 170.

The protection layer 190 covers the LED 170 and protects the LED 170. Specifically, the protection layer 190 may include a plurality of prism patterns and/or a plurality of regular tetrahedral patterns. That is, in some embodiments, the protection layer 190 may include a plurality of patterns, preferably each having a triangular cross-section. In other words, a plurality of triangular patterns may be disposed in a row in a cross-sectional view of the protection layer 190.

Further, the protection layer 190 may be formed as an organic insulating layer. More specifically, the protection layer 190 may be made of an acrylic organic material, but is not limited thereto. For example, the protection layer 190 may be formed as a single inorganic layer or a plurality of inorganic layers of silicon nitride (SiNx), silicon oxide (SiOx) and silicon oxynitride (SiON). Alternatively, the protection layer 190 may be formed as a multilayer in which an organic layer and an inorganic layer are laminated.

Thus, an upper surface of the protection layer 190 may have a smaller contact area than a lower surface of the protection layer 190. Therefore, a contact area between the upper surface of the protection layer 190 and the upper substrate 112 may be smaller than a contact area between the lower surface of the protection layer 190 and the LED 170 and the bank 147.

Accordingly, when the display device 100 is stretched, a stretching stress applied to the upper substrate 112 is not all transferred to the protection layer 190. Due to the protection layer 190 including a plurality of patterns each having a triangular cross-section, a stretching stress transferred to the protection layer 190 can be reduced or eliminated. Thus, a stretching stress applied to the LED 170 can be reduced.

Accordingly, even when the display device 100 according to an embodiment of the present disclosure is repeatedly stretched, it is possible to suppress damage to the LED 170. Thus, the stretching reliability of the display device 100 can be improved.

Thus, by providing a layer between LED 170 and the upper substrate 112, which further supports a bending less or no damages are caused during bending of the display device. The layer preventing the damages has different contact areas at its upper and lower side, thereby reducing the risk of cracks during bending.

Also, since the protection layer 190 includes the plurality of patterns each having a triangular cross-section, the extraction efficiency of light emitted to above the LED 170 can be increased. Thus, the luminance of the display device 100 according to an embodiment of the present disclosure can be improved. Further, a driving current for the display device 100 according to an embodiment of the present disclosure to implement a uniform luminance can be reduced. Accordingly, it is possible to reduce power consumption of the display device 100 according to an embodiment of the present disclosure.

Further, the upper substrate 112 is disposed on the protection layer 190.

The upper substrate 112 serves to support and/or cover various components disposed under the upper substrate 112. Specifically, the upper substrate 112 may be formed by coating and hardening a material forming the upper substrate 112 on the lower substrate 111 and the first substrates 121. Thus, the upper substrate 112 may be disposed to be in contact with the lower substrate 111, the first substrates 121, the second substrate 122 and the connection lines 180.

The upper substrate 112 may be made of the same material as the lower substrate 111. For example, the upper substrate 112 may be made of silicone rubber such as polydimethylsiloxane (PDMS) and an elastomer such as polyurethane (PU), and polytetrafluoroethylene (PTFE) or the like. Thus, the upper substrate 112 may have flexibility. However, the materials of the upper substrate 112 are not limited thereto.

Meanwhile, although not shown in FIG. 3, a polarizing layer may also be disposed on the upper substrate 112. The polarizing layer polarizes light incident from the outside of the display device 100 and reduces reflection of external light. Further, instead of the polarizing layer, other optical films or the like may be disposed on the upper substrate 112.

Also, a filling layer 113 may be disposed on a front surface of the lower substrate 111 to fill a space between the upper substrate 112 and components disposed on the lower substrate 111. The filling layer may be made of a curable adhesive. Specifically, a material of the filling layer may be coated on the front surface of the lower substrate 111 and then cured to form the filling layer. Thus, a filling layer 113 may be disposed between the upper substrate 112 and the components disposed on the lower substrate 111.

Circuit Structure of Active Area

Figure 4:
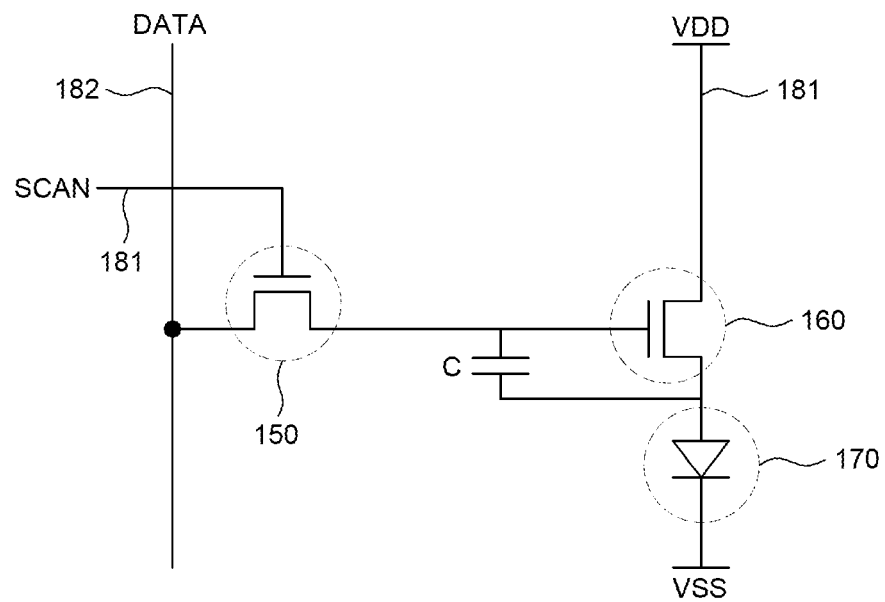
FIG. 4 is a circuit diagram of a sub-pixel of the display device according to an embodiment of the present disclosure.

FIG. 4 is a circuit diagram of a sub-pixel of the display device according to an embodiment of the present disclosure.

Hereinafter, for the convenience of description, a structure and an operation when a sub-pixel SPX of the display device according to an embodiment of the present disclosure is a pixel circuit of 2T (transistor) 1C (capacitor) will be described. However, the present disclosure is not limited thereto.

Referring to FIG. 3 and FIG. 4, in the display device according to an embodiment of the present disclosure, each sub-pixel SPX may include a switching transistor 150, a driving transistor 160, a storage capacitor C and an LED 170.

The switching transistor 150 applies a data signal DATA supplied through the second connection lines 182 to the driving transistor 160 and the storage capacitor C in response to a gate signal SCAN supplied through the first connection lines 181.

The gate electrode 151 of the switching transistor 150 is electrically connected to the first connection lines 181. Also, the source electrode 153 of the switching transistor 150 is connected to the second connection lines 182. Further, the drain electrode 154 of the switching transistor 150 is connected to the gate electrode 161 of the driving transistor 160.

The driving transistor 160 may operate to enable a driving current according to a high-potential power VDD supplied through the first connection lines 181 and the data voltage DATA supplied through the second connection lines 182 to flow in response to the data voltage DATA stored in the storage capacitor C.

Further, the gate electrode 161 of the driving transistor 160 is electrically connected to the drain electrode 154 of the switching transistor 150. Furthermore, the source electrode of the driving transistor 160 is connected to the first connection lines 181. Moreover, the drain electrode 164 of the driving transistor 160 is connected to the LED 170.

The LED 170 may operate to emit light according to a driving current formed by the driving transistor 160. Also, as described above, the n-electrode 174 of the LED 170 may be connected to the first connection lines 181 and thus may be applied with a low-potential power VSS. Further, the p-electrode 174 of the LED 170 may be connected to the drain electrode 164 of the driving transistor 160 and thus may be applied with a driving voltage corresponding to the driving current.

Each sub-pixel SPX of the display device according to an embodiment of the present disclosure is configured to have a 2T1C structure including the switching transistor 150, the driving transistor 160, the storage capacitor C and the LED 170 as an example. However, when a compensation circuit is added, each sub-pixel SPX may be configured in various ways, such as 3T1C, 4T2C, 5T2C, 6T1C, 6T2C, 7T1C or 7T2C.

As described above, the display device according to an embodiment of the present disclosure may include a plurality of sub-pixels on a first substrate which is a rigid substrate. Each of the plurality of sub-pixels SPX may include a switching transistor, a driving transistor, a storage capacitor and an LED.

Therefore, the display device according to an embodiment of the present disclosure can be stretched due to a lower substrate. Also, each first substrate includes a pixel circuit having a 2T1C structure. Thus, it is possible to emit light depending on a data voltage at each gate timing.

Hereinafter, a display device 500 according to another embodiment of the present disclosure will be described in detail. The display device 500 according to another embodiment of the present disclosure is different from the display device 100 according to an embodiment of the present disclosure only in terms of the placement of a protection layer. Accordingly, a detailed description of the same parts as those of the display device 100 according to an embodiment of the present disclosure will be omitted, and the above-described difference will be described in detail.

Another Embodiment of Present Disclosure—Second Embodiment

Figure 5:
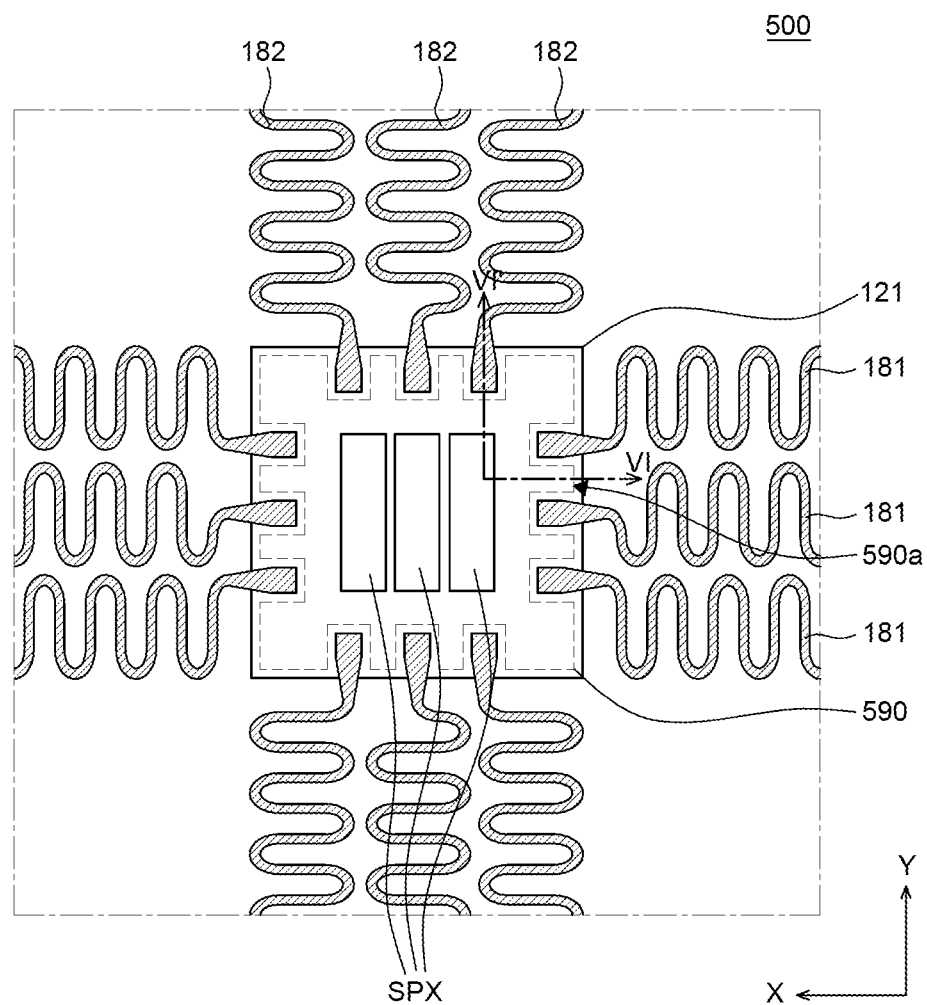
FIG. 5 is an enlarged plan view of an active area of a display device according to another embodiment of the present disclosure.
Figure 6:
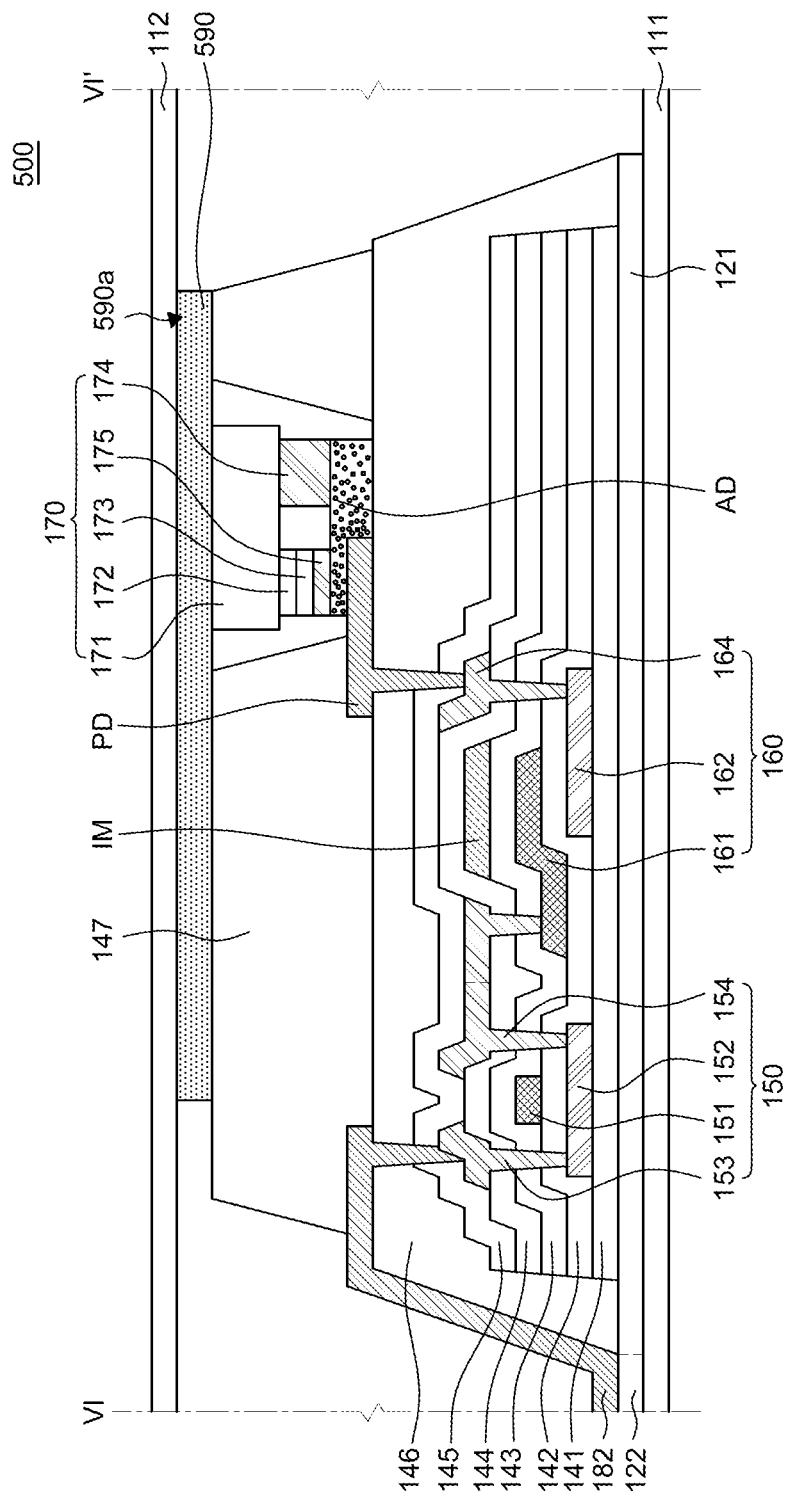
FIG. 6 is a schematic cross-sectional view as taken along a line VI-VI' of FIG. 5.

FIG. 5 is an enlarged plan view of an active area of a display device according to another embodiment of the present disclosure. FIG. 6 is a schematic cross-sectional view as taken along a line VI-VI' of FIG. 5.

As shown in FIG. 5, in the display device 500 according to another embodiment of the present disclosure, a protection layer 590 may be disposed on a pixel including a plurality of sub-pixels SPX to cover the pixel including the plurality of sub-pixels SPX. Specifically, the protection layer 590 may overlap the plurality of sub-pixels SPX, but may not overlap the plurality of connection lines 180 extended on the first substrate 121. Thus, the protection layer 590 may have a shape including tips each disposed between the plurality of connection lines 180.

Referring to FIG. 6, the protection layer 590 is disposed on the bank 147 and the LED 170.

The protection layer 590 covers the LED 170 and protects the LED 170. Specifically, an upper surface of the protection layer 590 may be in contact with the upper substrate 112, and a lower surface of the protection layer 590 may be in contact with the bank 147 and the LED 170. That is, the protection layer 590 may fill a space between the upper substrate 112 and the bank 147 and the LED 170.

Further, the protection layer 590 may be formed as an organic insulating layer. More specifically, the protection layer 590 may be made of an acrylic organic material, but is not limited thereto. For example, the protection layer 590 may be formed as a single inorganic layer or a plurality of inorganic layers of silicon nitride (SiNx), silicon oxide (SiOx) and silicon oxynitride (SiON). Alternatively, the protection layer 590 may be formed as a multilayer in which an organic layer and an inorganic layer are laminated.

That is, in the display device 500 according to another embodiment of the present disclosure, the tips 590a, which are parts of the protection layer 590, may be disposed between the plurality of connection lines 180. Thus, when the LED 170 is transferred in the display device 500 according to another embodiment of the present disclosure, the LED 170 may be aligned based on the tips 590a of the protection layer 590. Therefore, it is possible to more precisely transfer the LED 170 in the display device 500 according to another embodiment of the present disclosure. Thus, the yield of the transfer process can be improved.

Hereinafter, a display device 700 according to yet another embodiment of the present disclosure will be described in detail. The display device 700 according to yet another embodiment of the present disclosure is different from the display device 100 according to an embodiment of the present disclosure only in terms of the placement of a protection layer. Accordingly, a detailed description of the same parts as those of the display device 100 according to an embodiment of the present disclosure will be omitted, and the above-described difference will be described in detail.

Yet Another Embodiment of Present Disclosure—Third Embodiment

Figure 7:
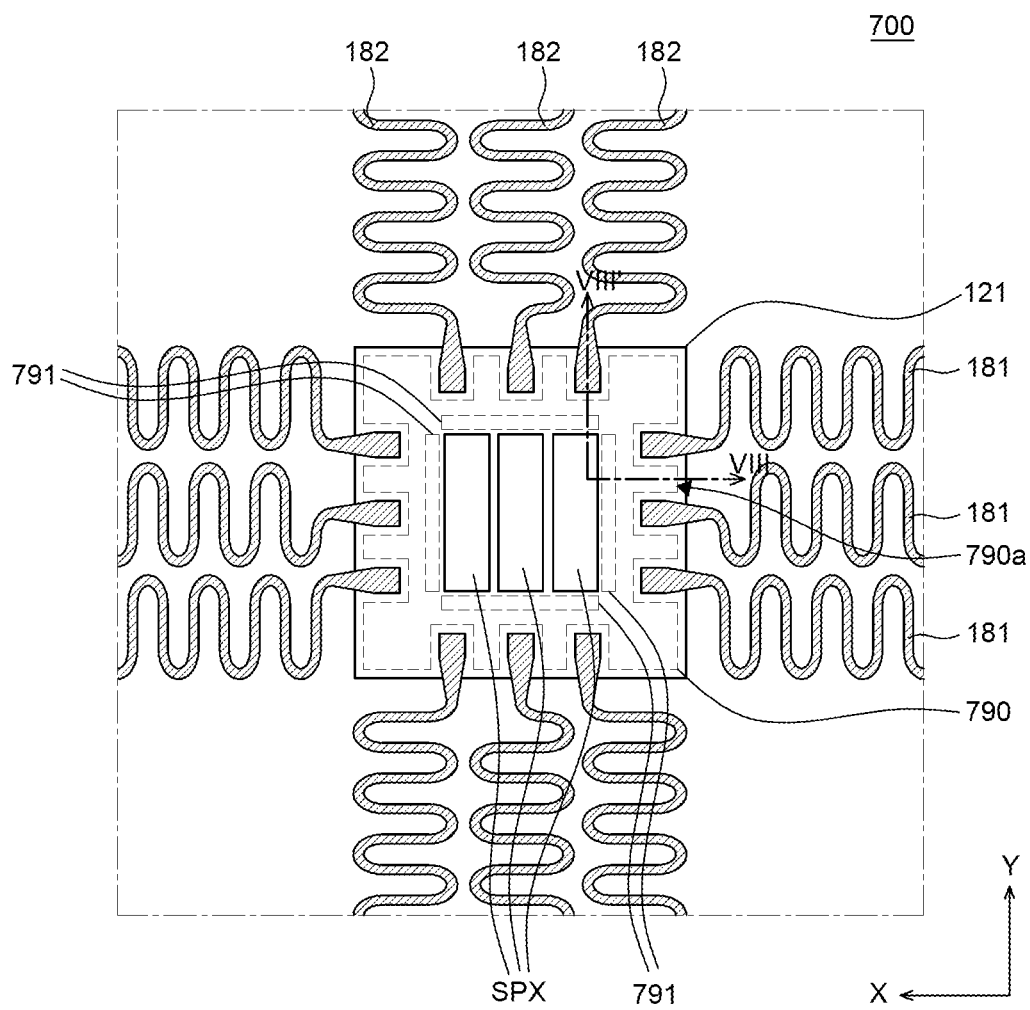
FIG. 7 is an enlarged plan view of an active area of a display device according to yet another embodiment of the present disclosure.
Figure 8:
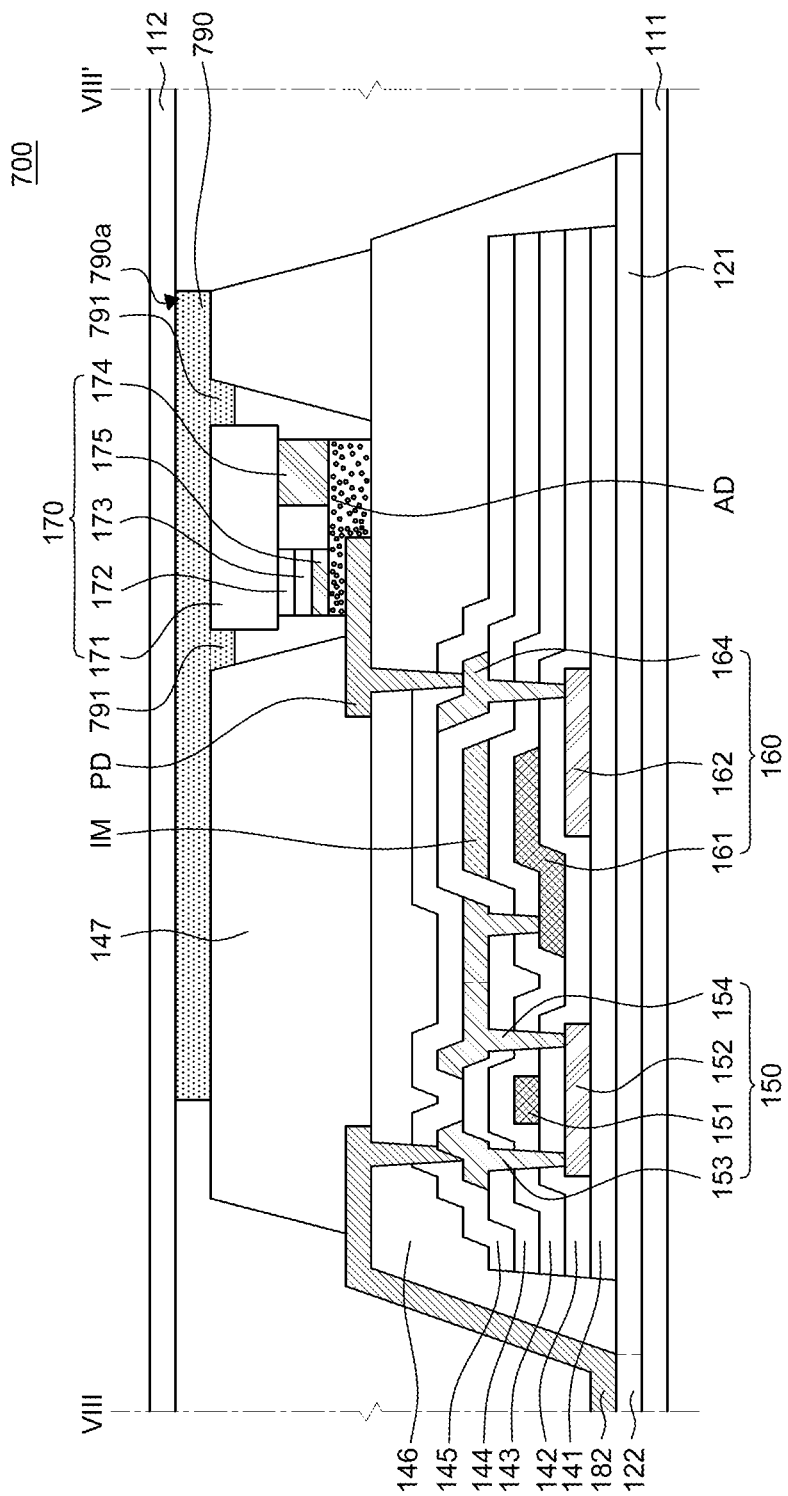
FIG. 8 is a schematic cross-sectional view as taken along a line VIII-VIII' of FIG. 7.

FIG. 7 is an enlarged plan view of an active area of a display device according to yet another embodiment of the present disclosure. FIG. 8 is a schematic cross-sectional view as taken along a line VIII-VIII' of FIG. 7.

As shown in FIG. 7, in the display device 700 according to yet another embodiment of the present disclosure, a protection layer 790 may be disposed on a pixel including a plurality of sub-pixels SPX to cover the pixel including the plurality of sub-pixels SPX. Specifically, the protection layer 790 may overlap the plurality of sub-pixels SPX, but may not overlap the plurality of connection lines 180 extended on the first substrate 121. Thus, the protection layer 790 may have a shape including tips each disposed between the plurality of connection lines 180.

Also, a plurality of protrusions 791 may be disposed on the sides of the plurality of sub-pixels SPX. As shown in FIG. 7, the plurality of protrusions 791 may be disposed on all the four sides of the plurality of sub-pixels SPX, but is not limited thereto. The plurality of protrusions 791 may be disposed on at least two of the four sides of the plurality of sub-pixels SPX. For example, the plurality of protrusions 791 may be disposed on the upper and lower sides along the Y-axis of the plurality of sub-pixels SPX. Alternatively, the plurality of protrusions 791 may be disposed on the left and right sides along the X-axis of the plurality of sub-pixels SPX.

Referring to FIG. 8, the protection layer 790 is disposed on the bank 147 and the LED 170.

The protection layer 790 covers the LED 170 and protects the LED 170. Specifically, an upper surface of the protection layer 790 may be in contact with the upper substrate 112, and a lower surface of the protection layer 790 may be in contact with the bank 147 and the LED 170. That is, the protection layer 790 may fill a space between the upper substrate and the bank 147 and the LED 170.

Further, the plurality of protrusions 791 may be an embossed pattern protruding downwards from the protection layer 790. Thus, the plurality of protrusions 791 may be in contact with a side surface of the LED 170 disposed under the protection layer 790. Also, the plurality of protrusions 791 may be in contact with a side surface of the bank 147 disposed under the protection layer 790.

More specifically, referring to FIG. 8, the plurality of protrusions 791 may be disposed between the LED 170 and the bank 147 disposed under the protection layer 790 and may be in contact with the LED 170 and the bank 147.

However, the present disclosure is not limited thereto. The plurality of protrusions 791 may be in contact with only a side surface of the LED 170 disposed under the protection layer 790, but may not be in contact with a side surface of the bank 147.

Further, the protection layer 790 and all of the plurality of protrusions 791 may be formed as an organic insulating layer. More specifically, the protection layer 790 and all of the plurality of protrusions 791 may be made of an acrylic organic material, but is not limited thereto. For example, the protection layer 790 may be formed as a single inorganic layer or a plurality of inorganic layers of silicon nitride (SiNx), silicon oxide (SiOx) and silicon oxynitride (SiON). Alternatively, the protection layer 790 may be formed as a multilayer in which an organic layer and an inorganic layer are laminated.

That is, in the display device 700 according to yet another embodiment of the present disclosure, the tips 790a, which are parts of the protection layer 790, may be disposed between the plurality of connection lines 180. Thus, when the LED 170 is transferred in the display device 700 according to yet another embodiment of the present disclosure, the LED 170 may be aligned based on the tips 790a of the protection layer 790. Therefore, it is possible to more precisely transfer the LED 170 in the display device 700 according to yet another embodiment of the present disclosure. Thus, the yield of the transfer process can be improved.

Further, in the display device 700 according to yet another embodiment of the present disclosure, the plurality of protrusions 791 protruding downwards from the protection layer 790 may be disposed on both sides of the LED 170. Thus, due to the plurality of protrusions 791, the LED may not be misaligned and can be disposed in an accurate area. Furthermore, even when the LED is bonded to the connection pad PD, the LED can be aligned based on the plurality of protrusions 791. Therefore, in the display device 700 according to yet another embodiment of the present disclosure, the yield of a process of bonding the LED 170 can be improved.

Hereinafter, a display device 900 according to still another embodiment of the present disclosure will be described in detail. The display device 900 according to still another embodiment of the present disclosure is different from the display device 100 according to an embodiment of the present disclosure only in terms of the placement of the protection layer 790. Accordingly, a detailed description of the same parts as those of the display device 100 according to an embodiment of the present disclosure will be omitted, and the above-described difference will be described in detail.

Still Another Embodiment of Present Disclosure—Fourth Embodiment

Figure 9:
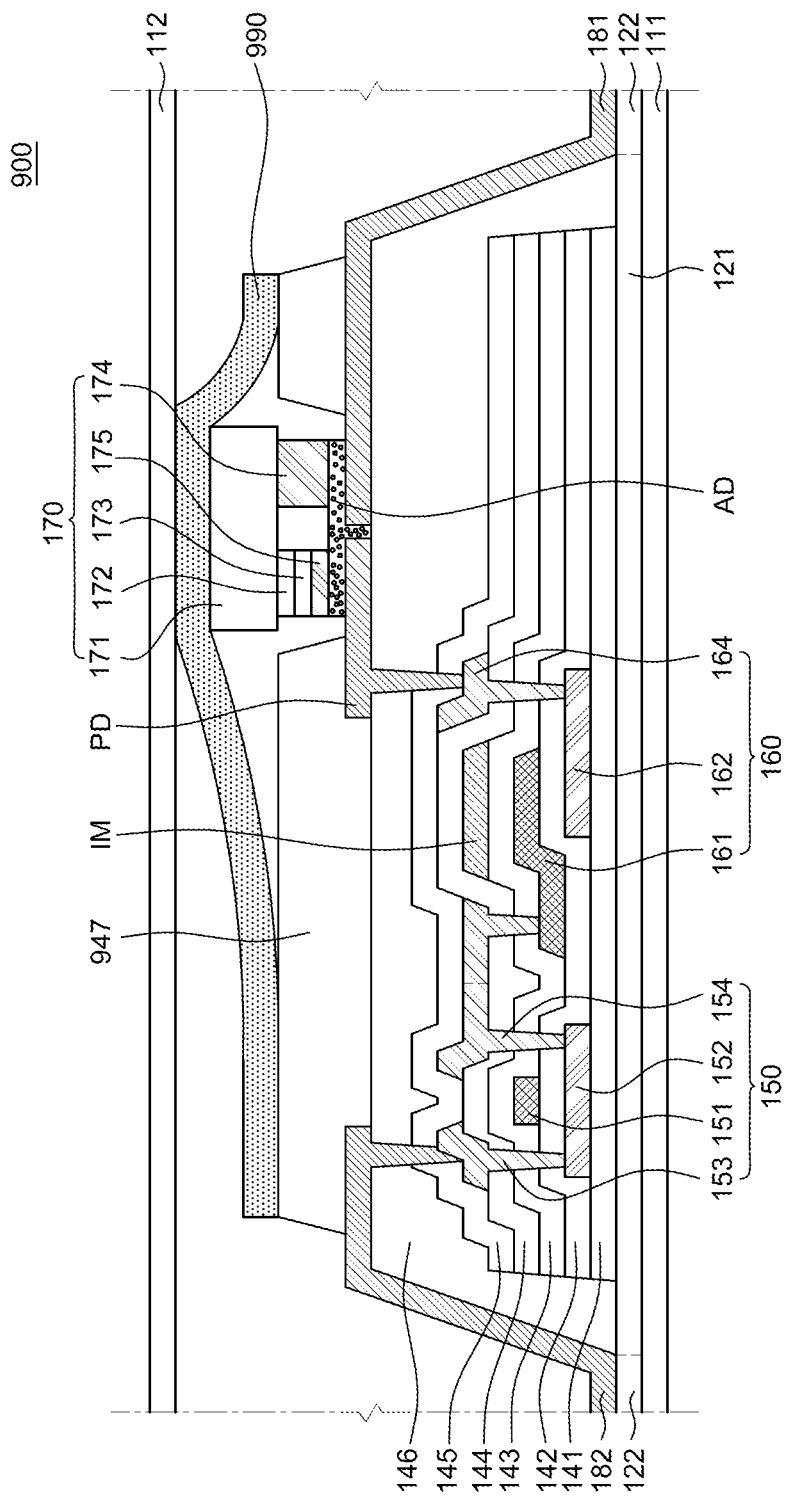
FIG. 9 is a cross-sectional view of a display device according to still another embodiment of the present disclosure.

FIG. 9 is a cross-sectional view of a display device 900 according to still another embodiment of the present disclosure.

As shown in FIG. 9, in the display device 900 according to still another embodiment of the present disclosure, a bank 947 may have a lower height than the LED 170.

Further, a protection layer 990 overlaps the plurality of sub-pixels SPX and may also overlap the plurality of connection lines 180 extended on the first substrate 121. Furthermore, a shape of the protection layer 990 may have a quadrangular pattern which is the same as a shape of the first substrate 121, but is not limited thereto. The protection layer 990 may have various shapes on the first substrate 121.

Also, the protection layer 990 is disposed on the bank 947 and the LED 170.

The protection layer 990 covers the LED 170 and protects the LED 170. Specifically, an upper surface of the protection layer 990 may be in contact with the upper substrate 112, and a lower surface of the protection layer 990 may be in contact with the bank 947 and the LED 170.

However, the bank 947 may have a lower height than the LED 170 as described above, and, thus, there is a step difference between an upper surface of the bank 947 and an upper surface of the LED 170. Therefore, the protection layer 990 is in contact with the upper surface of the bank 947 and the upper surface of the LED 170 between which there is a step difference. Accordingly, the protection layer 990 may have a shape like a blanket covering the entire pixel including a plurality of sub-pixels.

As shown in FIG. 9, a separation space which cannot be covered by the protection layer 990 may be formed at a side surface of the bank 947 and a side surface of the LED 170. However, the present disclosure is not limited thereto. The protection layer 990 may be conformally formed along the side surface of the bank 947 and the side surface of the LED 170.

Further, the protection layer 990 may be formed as an organic insulating layer. More specifically, the protection layer 990 may be made of an acrylic organic material, but is not limited thereto. For example, the protection layer 990 may be formed as a single inorganic layer or a plurality of inorganic layers of silicon nitride (SiNx), silicon oxide (SiOx) and silicon oxynitride (SiON). Alternatively, the protection layer 990 may be formed as a multilayer in which an organic layer and an inorganic layer are laminated.

That is, in the display device 900 according to still another embodiment of the present disclosure, the protection layer 990 may be formed covering the entire surface of a pixel including a plurality of pixels. Thus, even when the display device 900 according to still another embodiment of the present disclosure is stretched, the LED 170 can be more firmly fixed by the protection layer 990. Therefore, even though the display device 900 according to still another embodiment of the present disclosure is repeatedly stretched, the LED 170 can be stably bonded. Thus, the stretching reliability of the display device 900 according to still another embodiment of the present disclosure can be improved.

The embodiments of the present disclosure can also be described as follows:

According to an aspect of the present disclosure, the display device includes: a stretchable lower substrate and a plurality of first substrates disposed on the lower substrate. The display device also includes a plurality of second substrates connecting first substrates adjacent to each other among the plurality of first substrates. The display device further includes a plurality of pixels disposed on the plurality of first substrates. The display device also includes a plurality of connection lines disposed on the plurality of second substrates and connecting the plurality of pixels. The display device further includes a protection layer disposed on each of the plurality of pixels.

The plurality of connection lines may be extended on the plurality of first substrates, and the protection layer may overlap the plurality of connection lines.

The plurality of connection lines may be extended on the plurality of first substrates, and the protection layer may not overlap the plurality of connection lines.

The protection layer may include a plurality of patterns each having a triangular cross-section.

The plurality of pixels may include an LED that emits light and a bank defining the plurality of pixels, and an upper substrate that may be stretchable may be disposed on the protection layer.

A contact area between the protection layer and the upper substrate may be smaller than a contact area between the protection layer and the LED and the bank.

There may be no step difference between an upper surface of the LED and an upper surface of the bank.

There may be a step difference between an upper surface of the LED and an upper surface of the bank.

The display device may further comprise a plurality of protrusions disposed on at least two sides of the plurality of pixels.

The plurality of protrusions may be an embossed pattern protruding from the protection layer and may be in contact with a side surface of the LED.

According to another aspect of the present disclosure, the display device includes: a ductile substrate that is reversibly expandable and contractible, a plurality of rigid substrates disposed to be spaced apart from each other on the ductile substrate, a plurality of pixels disposed on the plurality of rigid substrates, a plurality of connection lines disposed on the plurality of rigid substrates and connecting the plurality of pixels, a protection layer covering the plurality of pixels and a plurality of tips disposed outside the protection layer.

The plurality of tips may not overlap the plurality of connection lines.

The protection layer may include a plurality of prism patterns or a plurality of regular tetrahedral patterns.

The display device may further comprises a plurality of protrusions protruding downwards from the protection layer.

The plurality of protrusions may be in contact with an LED included in each of the plurality of pixels.

Although the embodiments of the present disclosure have been described in detail with reference to the accompanying drawings, the present disclosure is not limited thereto and may be embodied in many different forms without departing from the technical concept of the present disclosure. Therefore, the embodiments of the present disclosure are provided for illustrative purposes only but not intended to limit the technical concept of the present disclosure. The scope of the technical concept of the present disclosure is not limited thereto. Therefore, it should be understood that the above-described embodiments are illustrative in all aspects and do not limit the present disclosure. The protective scope of the corresponding published application and any patent granted present disclosure should be construed based on the following claims. All the technical concepts disclosed herein and the equivalent scope thereof should be construed as falling within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:
a stretchable lower substrate;
a plurality of first substrates disposed on the lower substrate;
a plurality of second substrates coupling first substrates adjacent to each other among the plurality of first substrates;
a plurality of pixels disposed on the plurality of first substrates, each of the plurality of pixels including:
a light emitting diode (LED); and
a bank adjacent to the light emitting diode, the bank having an upper surface and a side surface extending from the upper surface;
a plurality of connection lines disposed on the plurality of second substrates and coupling the plurality of pixels;
a protection layer disposed on the light emitting diode and the bank of each pixel; and
an upper substrate disposed on the protection layer; and
a polarizing layer disposed on the upper substrate,
wherein the protection layer is spaced apart from the side surface of the bank of each pixel, and
wherein the protection layer is disposed between the bank and the upper substrate.

2. The display device according to claim 1, wherein the plurality of connection lines is extended on the plurality of first substrates.

3. The display device according to claim 2, wherein the protection layer overlaps the plurality of connection lines.

4. The display device according to claim 2, wherein the protection layer does not overlap the plurality of connection lines.

5. The display device according to claim 1, wherein the protection layer includes a plurality of patterns.

6. The display device according to claim 1, wherein a contact area between the protection layer and the upper substrate is smaller than a contact area between the protection layer and the LED and the bank.

7. The display device according to claim 1, wherein there is no step difference between an upper surface of the LED and the upper surface of the bank.

8. The display device according to claim 1, wherein there is a step difference between an upper surface of the LED and the upper surface of the bank.

9. The display device according to claim 1, further comprising a plurality of protrusions disposed on at least two sides of the plurality of pixels.

10. The display device according to claim 9, wherein the plurality of protrusions are an embossed pattern protruding from the protection layer and is in contact with a side surface of the LED.

11. A display device, comprising:
a ductile substrate that is reversibly expandable and contractible;

a plurality of rigid substrates disposed to be spaced apart from each other on the ductile substrate;

a plurality of pixels disposed on the plurality of rigid substrates;

a plurality of connection lines disposed on the plurality of rigid substrates and coupling the plurality of pixels;

a protection layer covering the plurality of pixels, the protection layer including a plurality of tips, wherein the plurality of tips is disposed between the plurality of connection lines such that the plurality of tips does not overlap with the plurality of connection lines from a plan view.

12. The display device according to claim 11, wherein the protection layer includes a plurality of prism patterns.

13. The display device according to claim 11, wherein the protection layer includes a plurality of regular tetrahedral patterns.

14. The display device according to claim 11, further comprising: a plurality of protrusions protruding downwards from the protection layer.

15. The display device according to claim 14, wherein the plurality of protrusions is in contact with an LED included in each of the plurality of pixels.

16. A display device, comprising:

a lower substrate;

a plurality of first substrates disposed on the lower substrate;

a plurality of second substrates coupling first substrates adjacent to each other among the plurality of first substrates;

a plurality of pixels disposed on the plurality of first substrates, each of the plurality of pixels including:

a light emitting diode (LED); and a bank adjacent to the light emitting diode, the bank having an upper surface and a side surface extending from the upper surface;

a plurality of connection lines disposed on the plurality of second substrates and coupling the plurality of pixels;

a protection layer disposed on the light emitting diode and the bank;

an upper substrate disposed on the protection layer, and a polarizing layer disposed on the upper substrate, wherein the protection layer includes at least one inorganic layer and at least one organic layer, and wherein the protection layer is disposed between the bank and the upper substrate.

17. The display device of claim 16, wherein the protection layer includes a triangular cross-section.

18. The display device of claim 16, wherein the protection layer includes an upper surface and a lower surface, and wherein at least some portions of the lower surface of the protection layer is are spaced apart from the bank.

* * * * *